(12) United States Patent
Blomiley et al.

(10) Patent No.: US 7,531,395 B2
(45) Date of Patent: May 12, 2009

(54) METHODS OF FORMING A LAYER COMPRISING EPITAXIAL SILICON, AND METHODS OF FORMING FIELD EFFECT TRANSISTORS

(75) Inventors: Eric R. Blomiley, Boise, ID (US); Gurtej S. Sandhu, Boise, ID (US); Cem Basceri, Reston, VA (US); Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 228 days.

(21) Appl. No.: 11/035,298

(22) Filed: Jan. 12, 2005

(65) Prior Publication Data
US 2006/0051941 A1 Mar. 9, 2006

Related U.S. Application Data

(63) Continuation-in-part of application No. 10/932,151, filed on Sep. 1, 2004.

(51) Int. Cl.
H01L 21/84 (2006.01)
H01L 21/8238 (2006.01)
H01L 21/336 (2006.01)

(52) U.S. Cl. .................. 438/156; 438/206; 438/212; 438/269; 257/E21.41; 257/E21.571

(58) Field of Classification Search ........... 438/206, 438/156, 269, 212, 516; 257/E21.571, E21.643
See application file for complete search history.

(56) References Cited

U.S. PATENT DOCUMENTS

| 4,526,631 A | 7/1985 | Silvestri et al. |
| 4,528,047 A | 7/1985 | Beyer et al. |
| 4,758,531 A | 7/1988 | Beyer et al. |
| 4,816,098 A | 3/1989 | Davis et al. |
| 4,847,210 A * | 7/1989 | Hwang et al. ............. 438/59 |
| 5,039,625 A | 8/1991 | Reisman et al. |
| 5,073,516 A | 12/1991 | Moslehi |
| 5,198,071 A | 3/1993 | Scudder et al. |
| 5,248,385 A | 9/1993 | Powell |

(Continued)

OTHER PUBLICATIONS

Bashir et al., *Characterization and modeling of sidewall defects in selective epitaxial growth of silicon*, J. Vac. Sci. Technol. B 13(3), pp. 928-935 (May/Jun. 1995).

(Continued)

*Primary Examiner*—Walter L Lindsay, Jr.
*Assistant Examiner*—Ron E Pompey
(74) *Attorney, Agent, or Firm*—Wells St. John P.S.

(57) ABSTRACT

Methods of forming layers comprising epitaxial silicon, and methods of forming field effect transistors are disclosed. A method of forming a layer comprising epitaxial silicon includes etching an opening into a silicate glass-comprising material received over a monocrystalline material. The etching is conducted to the monocrystalline material effective to expose the monocrystalline material at a base of the opening. A silicon-comprising layer is epitaxially grown within the opening from the monocrystalline material exposed at the base of the opening. The silicate glass-comprising material is etched from the substrate effective to leave a free-standing projection of the epitaxially grown silicon-comprising layer projecting from the monocrystalline material which was at the base of the opening. Other implementations and aspects are contemplated.

53 Claims, 6 Drawing Sheets

U.S. PATENT DOCUMENTS

| | | | |
|---|---|---|---|
| 5,250,837 A | 10/1993 | Sparks | |
| 5,294,286 A | 3/1994 | Nishizawa et al. | |
| 5,340,754 A | 8/1994 | Witek et al. | |
| 5,460,994 A * | 10/1995 | Kim | 438/253 |
| 5,599,724 A | 2/1997 | Yoshida | |
| 5,707,885 A | 1/1998 | Lim | |
| 5,753,555 A | 5/1998 | Hada | |
| 5,763,305 A | 6/1998 | Chao | |
| 6,060,746 A | 5/2000 | Bertin et al. | |
| 6,064,081 A | 5/2000 | Robinson et al. | |
| 6,156,620 A * | 12/2000 | Puchner et al. | 438/400 |
| 6,204,532 B1 | 3/2001 | Gambino et al. | |
| 6,240,532 B1 | 3/2001 | Gambino et al. | |
| 6,297,531 B2 | 10/2001 | Armacost et al. | |
| 6,406,962 B1 | 6/2002 | Agnello et al. | |
| 6,436,770 B1 | 8/2002 | Leung et al. | |
| 6,437,375 B1 | 8/2002 | Beaman | |
| 6,448,129 B1 | 9/2002 | Cho et al. | |
| 6,492,216 B1 | 12/2002 | Yeo et al. | |
| 6,506,638 B1 | 1/2003 | Lu | |
| 6,518,609 B1 | 2/2003 | Ramesh | |
| 6,605,498 B1 | 8/2003 | Murthy et al. | |
| 6,617,226 B1 | 9/2003 | Suguro et al. | |
| 6,624,032 B2 | 9/2003 | Alavi et al. | |
| 6,632,712 B1 * | 10/2003 | Ang et al. | 438/212 |
| 6,642,539 B2 | 11/2003 | Ramesh et al. | |
| 6,660,590 B2 * | 12/2003 | Yoo | 438/268 |
| 6,703,290 B2 | 3/2004 | Boydston et al. | |
| 6,713,378 B2 | 3/2004 | Drynan | |
| 6,716,687 B2 | 4/2004 | Wang et al. | |
| 6,716,719 B2 | 4/2004 | Clampitt et al. | |
| 6,734,082 B2 * | 5/2004 | Zheng et al. | 438/435 |
| 6,746,923 B2 | 6/2004 | Skotnicki et al. | |
| 6,790,713 B1 | 9/2004 | Horch | |
| 6,805,962 B2 | 10/2004 | Bedell et al. | |
| 6,855,436 B2 | 2/2005 | Bedell et al. | |
| 6,858,499 B2 | 2/2005 | Bol | |
| 6,860,944 B2 | 3/2005 | Ivanov et al. | |
| 6,878,592 B1 | 4/2005 | Besser et al. | |
| 6,885,069 B2 | 4/2005 | Ohguro | |
| 6,919,258 B2 | 7/2005 | Grant et al. | |
| 6,946,377 B2 | 9/2005 | Chambers | |
| 7,033,877 B2 | 4/2006 | Chaudhry et al. | |
| 7,132,338 B2 | 11/2006 | Samoilov et al. | |
| 7,262,089 B2 * | 8/2007 | Abbott et al. | 438/243 |
| 2001/0010962 A1 | 8/2001 | Chen et al. | |
| 2001/0017392 A1 * | 8/2001 | Comfort et al. | 257/410 |
| 2001/0025985 A1 | 10/2001 | Noble | |
| 2001/0041438 A1 | 11/2001 | Maeda et al. | |
| 2002/0070430 A1 * | 6/2002 | Oh et al. | 257/622 |
| 2002/0081861 A1 | 6/2002 | Robinson et al. | |
| 2003/0027406 A1 | 2/2003 | Malone | |
| 2003/0153155 A1 | 8/2003 | Wang et al. | |
| 2003/0194496 A1 | 10/2003 | Xu et al. | |
| 2003/0211712 A1 | 11/2003 | Chen et al. | |
| 2003/0234414 A1 | 12/2003 | Brown | |
| 2004/0121546 A1 | 6/2004 | Yoo | |
| 2004/0241460 A1 | 12/2004 | Bedell et al. | |
| 2005/0224800 A1 | 10/2005 | Lindert et al. | |
| 2006/0046391 A1 | 3/2006 | Tang et al. | |
| 2006/0046440 A1 | 3/2006 | Ramaswami et al. | |
| 2006/0081884 A1 | 4/2006 | Abbott et al. | |
| 2006/0125044 A1 | 6/2006 | Haller | |
| 2006/0264010 A1 | 11/2006 | Ramaswamy et al. | |

OTHER PUBLICATIONS

U.S. Appl. No. 10/931,924, filed Sep. 2004, Ramaswami et al.
U.S. Appl. No. 10/932,129, filed Sep. 2004, Ramaswami et al.
U.S. Appl. No. 10/932,924, filed Sep. 2004, Ramaswami et al.

* cited by examiner

_Fig. 9_

_Fig. 10_

FIG. 11

METHODS OF FORMING A LAYER COMPRISING EPITAXIAL SILICON, AND METHODS OF FORMING FIELD EFFECT TRANSISTORS

RELATED PATENT DATA

This patent resulted from a continuation-in-part application of U.S. patent application Ser. No. 10/932,151, filed on Sep. 1, 2004, entitled "Methods Of Forming Layers Comprising Epitaxial Silicon" and naming Nirmal Ramaswamy, Gurtej S. Sandhu, Chris M. Carlson and F. Daniel Gealy as inventors, and the disclosure of which is hereby incorporated by reference.

TECHNICAL FIELD

This invention relates to methods of forming layers comprising epitaxial silicon, and to methods of forming field effect transistors.

BACKGROUND OF THE INVENTION

Silicon is a common semiconductive material used in the fabrication of integrated circuits. Silicon can occur in crystalline and amorphous forms, and when crystalline can be monocrystalline or polycrystalline. In some instances, silicon is combined with germanium, essentially forming a silicon germanium alloy. Such materials can be doped with conductivity enhancing impurities (i.e., boron and/or phosphorus) to modify the conducting characteristics of the silicon-comprising material.

Monocrystalline silicon can be provided in bulk substrate form or otherwise grown or deposited epitaxially from an exposed monocrystalline material. Epitaxy generally involves the growth or deposition of a single or monocrystalline layer of material such that the epitaxial layer has a crystal orientation which is common to that of the material from which it is grown. One factor that determines the quality of the epitaxial silicon-comprising layer relates to the presence and quantity of crystallographic defects. Such are non-uniformities in the crystal structure of the epitaxial layer. Many of these defects are caused by defects appearing at the surface of the substrate which propagate into the layer during growth. Examples include sidewall dislocations and stacking faults. Dislocations and stacking faults can be electrically active more so than the surrounding material within the epitaxial layer due to the presence of dangling bonds. Such can lead to unnecessary recombination generation currents, lower breakdown voltages, higher current leakage and larger junction ideality factors.

One place where epitaxial silicon has been utilized is as one or more of the components in a field effect transistor. Transistor structures comprise a channel region received between a pair of source/drain regions, and a gate configured to electrically connect the source/drain regions to one another through the channel region. The transistor constructions utilized in semiconductor constructions are supported by a semiconductor substrate. The semiconductor substrate will have a primary surface which can be considered to define a horizontal direction. Transistor devices can be divided into two broad categories based upon the orientations of the channel regions relative to the primary surface of the semiconductor substrate. Specifically, transistor structures which have channel regions that are primarily parallel to the primary surface of the substrate are referred to as planar or horizontal transistor structures, and those having channel regions which are generally perpendicular to the primary surface of the substrate are referred to as vertical transistor structures. Since current flow between the source and drain regions of a transistor device occurs through the channel region, planar transistor devices can be distinguished from vertical transistor devices based upon the direction of current flow as well as on the general orientation of the channel region. Specifically, vertical transistor devices are devices in which the current flow between the source and drain regions of the devices is primarily substantially orthogonal to a primary surface of a semiconductor substrate, and planar or horizontal transistor devices are devices in which the current flow between source and drain regions is primarily parallel to the primary surface of the semiconductor substrate.

Epitaxial silicon-comprising materials have been proposed for use in channel regions of vertical transistors. Further, one or both of the source/drain areas of a vertical transistor might also comprise epitaxially grown silicon or an epitaxially grown silicon germanium alloy. Requirements for epitaxial materials within a vertically oriented channel region are typically more stringent than for the use of such material in source/drain regions of horizontally oriented field effect transistors. Further, fabrication of vertical field effect transistors typically utilizes masks of oxide, nitride or other materials for self-aligned patterning of the epitaxial silicon-comprising material during its formation. The interface of the epi with these materials can be a defect source. Further, the selective epitaxial growth of silicon for vertical transistors typically utilizes lower deposition temperatures as compared to blanket epitaxial silicon depositions. Unfortunately, the use of lower temperatures reduces surface mobility and can also result in increased defects over that of higher temperature processing. Also and regardless, thermal stress can be generated during cool-down of the substrate from the temperature at which the epitaxial silicon-comprising material was grown. This can result in crystallographic defects being generated after growth.

Further, where the epitaxial silicon-comprising material includes germanium, such has an increased tendency for defect formation on the surface during deposition due to mismatched lattice constants of silicon and germanium. These defects propagate and either terminate with other defects or at the surface. Regardless, after deposition, crystallographic defects are extremely difficult to remove or heal within the bulk epitaxially grown material or at interfaces of such material with other materials.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

This invention includes methods of forming layers comprising epitaxial silicon, and methods of forming field effect transistors. In one implementation, a method of forming a layer comprising epitaxial silicon includes etching an opening into a silicate glass-comprising material received over a monocrystalline material. The etching is conducted to the monocrystalline material effective to expose the monocrystalline material at a base of the opening. A silicon-comprising layer is epitaxially grown within the opening from the monocrystalline material exposed at the base of the opening. The silicate glass-comprising material is etched from the substrate effective to leave a free-standing projection of the epitaxially grown silicon-comprising layer projecting from the monocrystalline material which was at the base of the opening.

In one implementation, a method of forming a layer comprising epitaxial silicon includes providing an opening within a silicate glass-comprising material received over a monocrystalline material. The opening comprises opposing sidewalls comprising silicate glass-comprising material. The opposing sidewalls of the opening are lined with a silicon nitride-comprising material, with monocrystalline material being exposed at a base of the lined opening. The silicon nitride-comprising material lines all of the opposing sidewalls of the silicate glass-comprising material. A silicon-comprising layer is epitaxially grown within the opening from the exposed monocrystalline material within the lined opening.

In one implementation, a method of forming a layer comprising epitaxial silicon includes providing an opening within a silicate glass-comprising material received over a monocrystalline material. The opening comprises opposing sidewalls comprising silicate glass-comprising material, and the opening comprises a base. Insulative material is formed atop the silicate glass-comprising material and within the opening along the opposing sidewalls to less than completely fill the opening. The insulative material is formed to a greater thickness atop the silicate glass-comprising material than over the opposing sidewalls and than over the base of the opening. The insulative material is different in composition from that of the silicate glass-comprising material. The insulative material is anisotropically etched effective to expose monocrystalline material at the base of the opening and to leave at least some of the insulative material atop the silicate glass-comprising material proximate the opening. A silicon-comprising layer is epitaxially grown within the opening from the exposed monocrystalline material at the base of the opening.

In one implementation, a method of forming a layer comprising epitaxial silicon includes providing an opening within a silicate glass-comprising material received over a monocrystalline material. The opening comprises opposing sidewalls comprising silicate glass-comprising material, and comprises a base. The opposing sidewalls are exposed to an activated nitrogen species generated by remote plasma effective to form a first silicon nitride-comprising layer over the opposing sidewalls. After the exposing, a second silicon nitride-comprising layer is chemical vapor deposited within the opening over the first silicon nitride-comprising layer. The first and second silicon nitride-comprising layers are anisotropically etched effective to expose monocrystalline material at the base of the opening. A silicon-comprising layer is epitaxially grown within the opening from the exposed monocrystalline material at the base of the opening.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
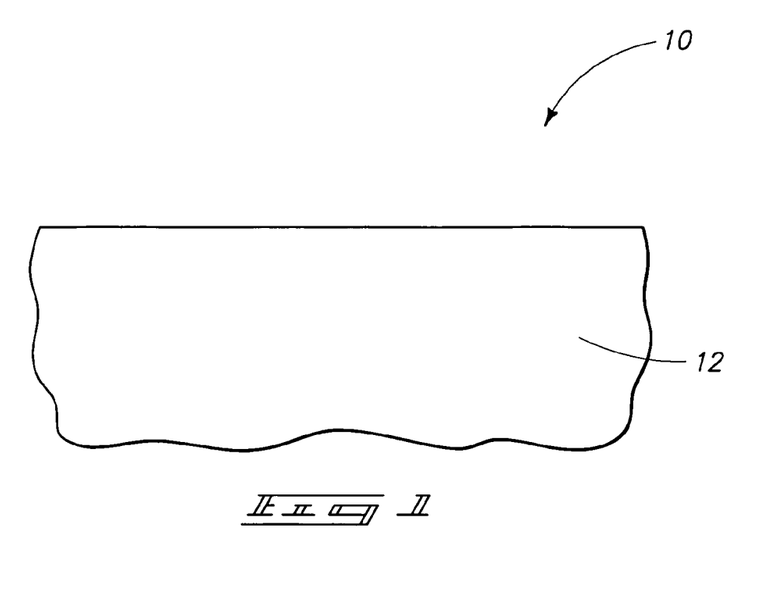
FIG. 1 is a diagrammatic section of a semiconductor wafer fragment in process in accordance with an aspect of the invention.

Exemplary preferred methods of forming a layer comprising epitaxial silicon are initially described with reference to FIGS. 1-9. Referring to FIG. 1, a semiconductor substrate in process is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 comprises a monocrystalline material 12, for example and by way of example only lightly doped monocrystalline silicon or a monocrystalline silicon germanium alloy. Such might be provided by any existing or yet-to-be developed methods, for example as a bulk monocrystalline substrate, a semiconductor-on-insulator substrate, epitaxially grown, etc. Monocrystalline material 12 might be a blanket exposed surface over the entirety of the substrate being processed or alternately, by way of example only, might be a masked or other partial surface of the substrate.

Figure 2:
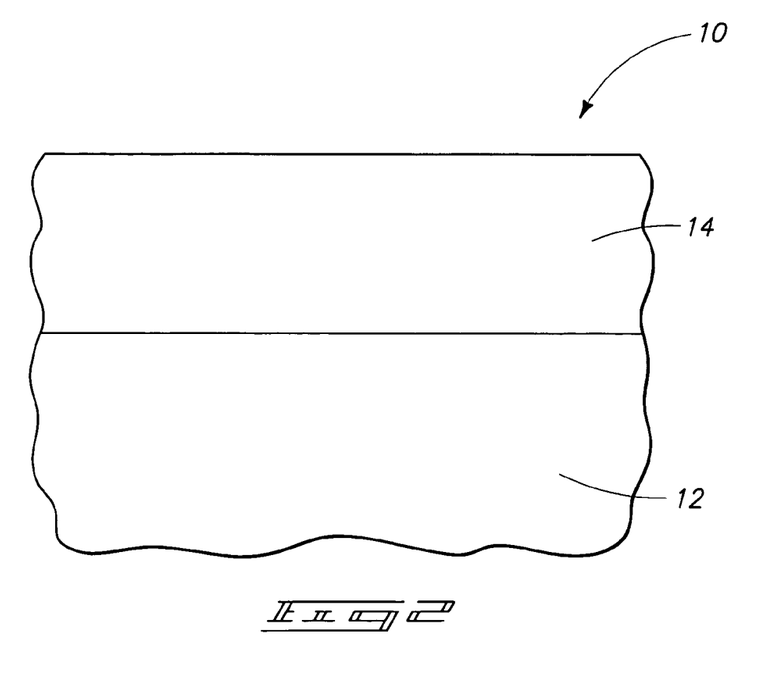
FIG. 2 is a view of the FIG. 1 substrate at a processing step subsequent to that depicted by FIG. 1.

Referring to FIG. 2, a silicate glass-comprising material 14 has been formed over monocrystalline material 12. Exemplary preferred materials include phosphosilicate glass (PSG), borosilicate glass (BSG) and borophosphosilicate glass (BPSG). By way of example only, a preferred thickness range for material 14 is from 100 Angstroms to 10,000 Angstroms. In the depicted exemplary FIG. 2 embodiment, silicate glass-comprising material 14 has been formed on monocrystalline material 12 (with "on" meaning in at least some direct physical contact therewith). Material 14 might also include or comprise additional materials other than silicate glasses, for example additional materials homogenously or non-homogenously distributed throughout, and/or including discrete layers of other materials. In one preferred implementation, material 14 consists essentially of one or a combination of silicate glasses.

Figure 3:
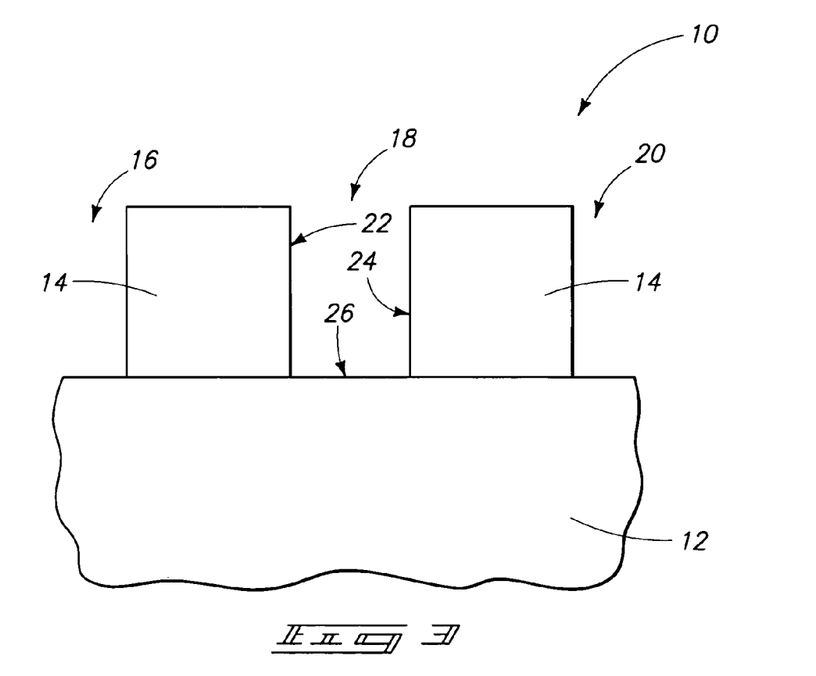
FIG. 3 is a view of the FIG. 2 substrate at a processing step subsequent to that depicted by FIG. 2.
Figure 4:
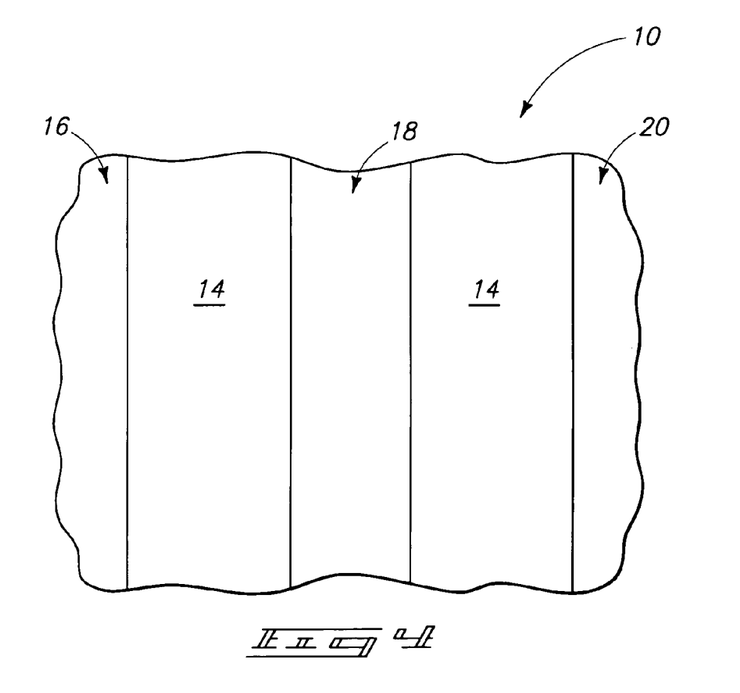
FIG. 4 is a top view of FIG. 3.

Referring to FIGS. 3 and 4, a series of openings 16, 18 and 20 has been provided within silicate glass-comprising material 14. Discussion proceeds with reference to opening 18, although typically a plurality of such similar type openings (i.e. openings 16 and 20) will be provided, and commonly processed as described. Regardless and accordingly, the invention contemplates processing as herein described whether occurring relative to a single opening or more than a single opening. In one preferred implementation, opening 18 is formed by etching into silicate glass-comprising material 14 to monocrystalline material 12 effective to expose monocrystalline material 12 at a base of opening 18 at this point in the process. Regardless, in one implementation, opening 18 comprises opposing sidewalls 22 and 24 comprising silicate glass-comprising material. In one implementation, opening 18 comprises a base 26 which in the illustrated and preferred embodiment at this point in the process comprises exposed monocrystalline material 12. A preferred manner of forming opening 18 is by photolithographic patterning and etch. In one preferred implementation, opening 18 is formed to be in the shape of a line trench formed within silicate glass-comprising material 14 (FIG. 4). Of course, opening 18 might be of any other shape including (by way of example only) circular, elliptical, oval, etc. Further in some implementations, opening 18 might not extend all the way to monocrystalline material 12 at this point in the process. By way of example only, a typical minimum opening width for opening 18 is from 100 Angstroms to 5,000 Angstroms.

Figure 5:
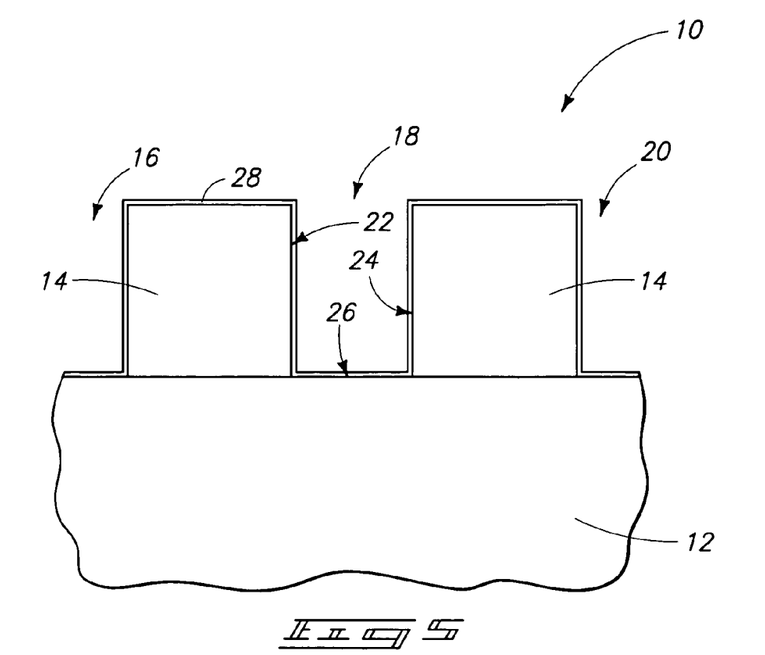
FIG. 5 is a view of the FIG. 3 substrate at a processing step subsequent to that depicted by FIG. 3.

Referring to FIG. 5, opposing sidewalls 22, 24 have been exposed to an activated nitrogen species generated by remote plasma effective to form a first silicon nitride-comprising layer 28 over opposing sidewalls 22 and 24. In the depicted exemplary preferred embodiment, such layer 28 also forms atop material 14 outside of opening 18, and as well over base 26 within opening 18. By way of example only, exemplary activated nitrogen species include those generated from $N_2$ and $NH_3$. For example, and by way of example only, such can be formed from a decoupled plasma nitridation process whereby $N_2$ and/or $NH_3$ is fed to a remote plasma generator at an exemplary temperature of 600° C. and at an exemplary pressure of 30 Torr. An exemplary preferred maximum thickness for first silicon nitride-comprising layer is from 5 Angstroms to 300 Angstroms, with a more preferred thickness being from 5 Angstroms to 50 Angstroms. In one preferred embodiment, and as depicted, first silicon nitride-comprising layer 28 conformally deposits over the substrate. Layer 28 is, however, optional in certain implementations of the invention as-claimed herein, and as will be apparent from the continuing discussion.

Figure 6:
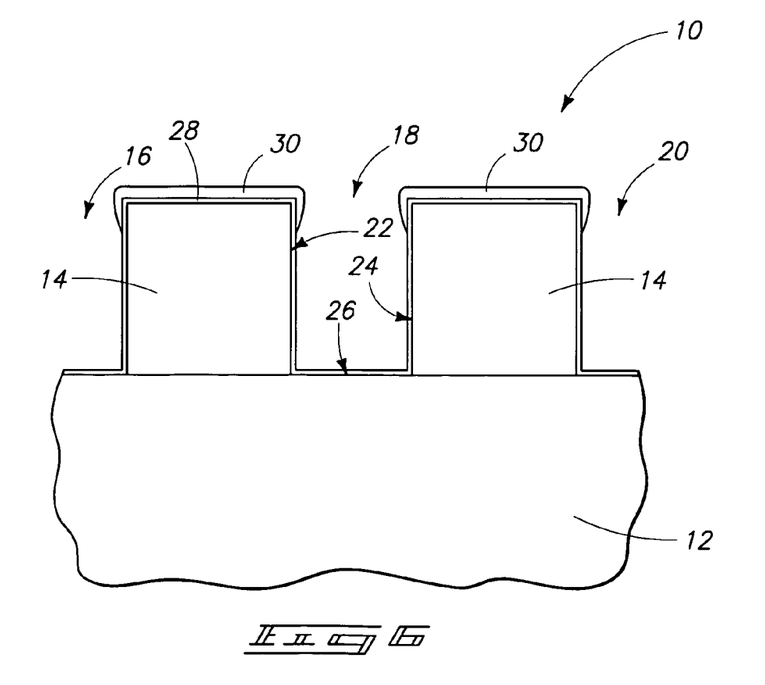
FIG. 6 is a view of the FIG. 5 substrate at a processing step subsequent to that depicted by FIG. 5.

Referring to FIG. 6, a second silicon nitride-comprising layer 30 has been chemical vapor deposited within opening 18 over first silicon nitride-comprising layer 28. An exemplary preferred maximum thickness range for second silicon nitride-comprising layer 30 is from 100 Angstroms to 300 Angstroms. In one exemplary preferred embodiment, and as shown, the second silicon nitride-comprising layer is chemical vapor deposited in a non-conformal manner, and whereby second silicon nitride-comprising layer 30 does not deposit conformally over base 26 of opening 18. In the depicted exemplary embodiment, none of material 30 has deposited onto layer 28 immediately over base 26, although aspects of the invention contemplate some of material 30 so depositing. An exemplary chemical vapor deposition method of forming second silicon nitride-comprising layer 30 as depicted includes $SiH_4$ at from 100 sccm to 1000 sccm, $NH_3$ at from 10 sccm to 1000 sccm, $N_2$ as a carrier gas, plasma power at from 10 W to 1000 W, wafer temperature at from 200° C. to 600° C., and pressure at from 1 Torr to 1000 Torr, particularly for opening-aspect ratios (height to minimum width) of at least one (1). Layer 30 is, however, optional in certain implementations of the invention as-claimed herein, and as will be apparent from the continuing discussion.

Figure 7:
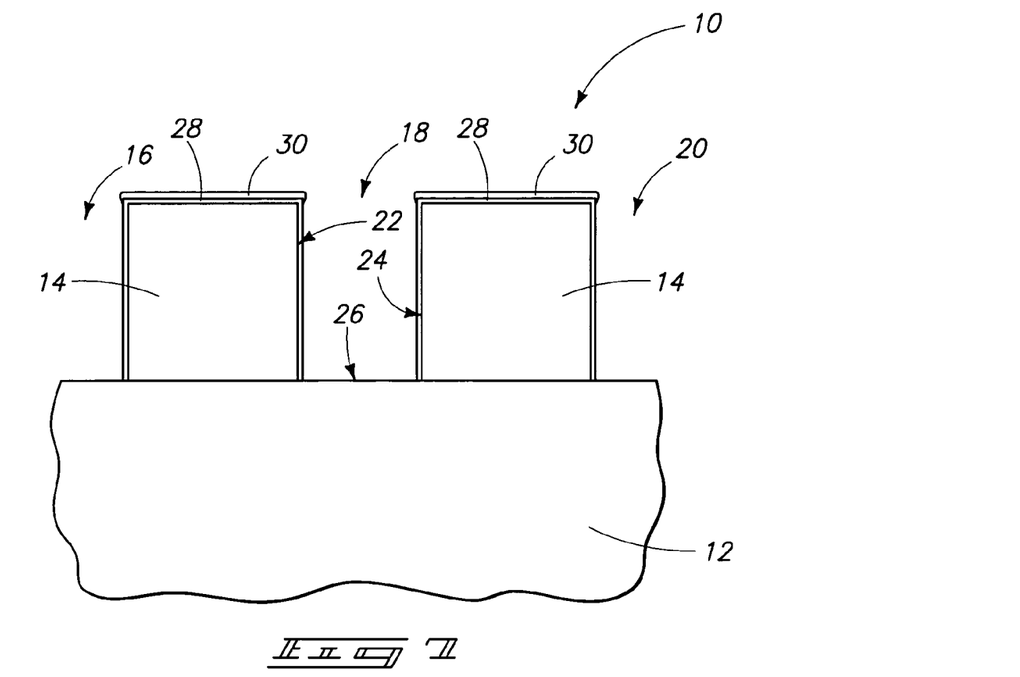
FIG. 7 is a view of the FIG. 6 substrate at a processing step subsequent to that depicted by FIG. 6.

Referring to FIG. 7, first and second silicon nitride-comprising layers 28 and 30, respectively, have been anisotropically etched effective to expose monocrystalline material 12 at base 26 of opening 18. An exemplary preferred etching chemistry for conducting the same includes $CF_4$, He, and Ar in plasma at from 5 mTorr to 100 mTorr pressure (with He and/or Ar acting as inert carrier). In the depicted and in one preferred implementation, such etching leaves some of materials 28 and 30 atop material 14, although such is not required in all implementations.

One implementation of a method of forming a layer comprising epitaxial silicon in accordance with an aspect of the invention comprises providing an opening within a silicate glass-comprising material received over a monocrystalline material, wherein the opening comprises opposing sidewalls comprising a silicate glass-comprising material. By way of example only, the above processing describes and depicts but one exemplary manner of doing so with respect to an opening 18. Further, such one exemplary manner comprises lining the opposing sidewalls of the opening with a silicon nitride-comprising material, with monocrystalline material being exposed at a base of the lined opening, and with the silicon nitride-comprising material lining all of the opposing sidewalls of the silicate glass-comprising material. By way of example only, the above described FIGS. 1-7 processing depicts such an example whereby layers 28 and 30 comprise nitride-comprising material. In one preferred aspect of such implementation, silicon nitride-comprising lining 28, 30, has a maximum thickness which is no greater than 500 Angstroms, and preferably no greater than 250 Angstroms. Further in one preferred aspect of such implementation, silicon nitride-comprising lining 28, 30 is thicker over the opening sidewalls at an uppermost portion of the opening than at a lowermost portion of the opening, for example as depicted in FIG. 7, and wherein in one preferred embodiment no silicon nitride-comprising lining 28, 30 is received over opening base 26 (not shown). Such an act of lining the opposing sidewalls can preferably occur as described above in the preferred embodiment methods of FIGS. 1-7, or by any other manner as-claimed and stated whether existing or yet-to-be developed in accordance with certain implementations of the invention.

Further and regardless, another implementation of the invention can be considered as including insulative material atop the silicate glass-comprising material and within the opening along the opposing sidewalls of the opening to less than completely fill the opening. The insulative material in such implementation is formed to a greater thickness atop the silicate glass-comprising material than over the opposing sidewalls and than over the base of the opening. In such implementation, such insulative material is different in composition from that of the silicate glass-comprising material. In one exemplary preferred such implementation as described above, the insulative material comprises silicon nitride, with the exemplary depicted composite of layers 28, 30 constituting such an exemplary insulative material as just stated. However, additional or alternate insulative materials are contemplated in certain implementations, for example silicon dioxide, including undoped silicon dioxide. In the context of this document, "undoped silicon dioxide" defines any silicon dioxide material having less than $10^{18}$ atoms/cm$^3$ of any of boron and/or phosphorous in such material. By way of example only, a preferred manner of depositing undoped silicon dioxide is by decomposition of tetraethylorthosilicate (TEOS). Further by way of example only, the insulative material (for example a composite of layers 28, 30) might comprise silicon nitride and silicon dioxide, for example where one of layers 28 and 30 comprises silicon dioxide and the other of layers 28 and 30 comprises silicon nitride. Further by way of example only, both of 28, 30 might comprise silicon dioxide. Further by way of example only, the insulative material might comprise silicon oxynitride. Further in one preferred aspect of this implementation, the insulative material has a maximum thickness which is no greater than 500 Angstroms, and even more preferably no greater than 250 Angstroms. Further in one preferred aspect, the insulative material is thicker over the sidewalls at an uppermost portion of the opening than at a lowestmost portion of the opening.

The insulative material is anisotropically etched effective to expose monocrystalline material at the base of the opening and to leave at least some of the insulative material atop the silicate glass-comprising material proximate the opening. The above-described processing through FIG. 7 is but one example of such preferred processing in a method of forming a layer comprising epitaxial silicon.

Figure 8:
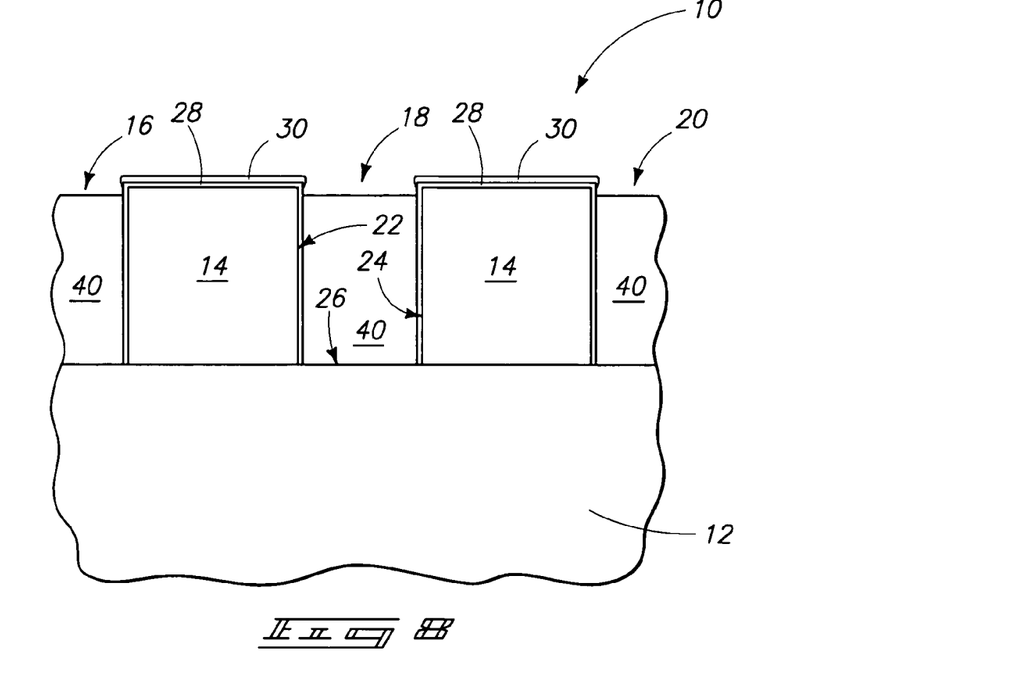
FIG. 8 is a view of the FIG. 7 substrate at a processing step subsequent to that depicted by FIG. 7.

Referring to FIG. 8, a silicon-comprising layer 40 has been epitaxially grown within opening 18 from exposed monocrystalline material 12 at base 26 of opening 18. Epitaxial growth of silicon-comprising layer 40 might occur by any existing or yet-to-be developed methods. An exemplary preferred technique includes a temperature range of from 300° C. to 1000° C., and a pressure range of from 10 mTorr to 100 Torr. Exemplary preferred gases for the deposition of epitaxial silicon include dichlorosilane at 0.2 liters/minute, $H_2$ at 20 liters/minute, and HCl at 0.15 liter/minute in a single wafer processor having a chamber volume of from 8 to 12 liters. If, by way of example only, the silicon-comprising layer is to comprise a silicon germanium alloy, $GeH_4$ is an exemplary preferred gas flowed proportionally relative to the volume flow of dichlorosilane to achieve the desired concentration of germanium. Epitaxially grown silicon-comprising material 40 might be provided to less than completely fill opening 18 (as shown), exactly fill opening 18, or overfill to extend above and outwardly of opening 18 relative to any of materials 14, 28 and 30.

In one exemplary implementation, the epitaxial growing preferably occurs at a temperature of at least 700° C., and even more preferably at a temperature of at least 800° C. A preferred, non-limiting, reason for epitaxial silicon growth at such temperatures is that silicate-glasses tend to soften at such elevated temperatures. Such might reduce compressive stress from the opening sidewalls otherwise created at lower temperatures by a silicate-glass material during epitaxial silicon growth, and perhaps hopefully result in fewer crystallographic defects in the epitaxial silicon-comprising material.

Figure 9:
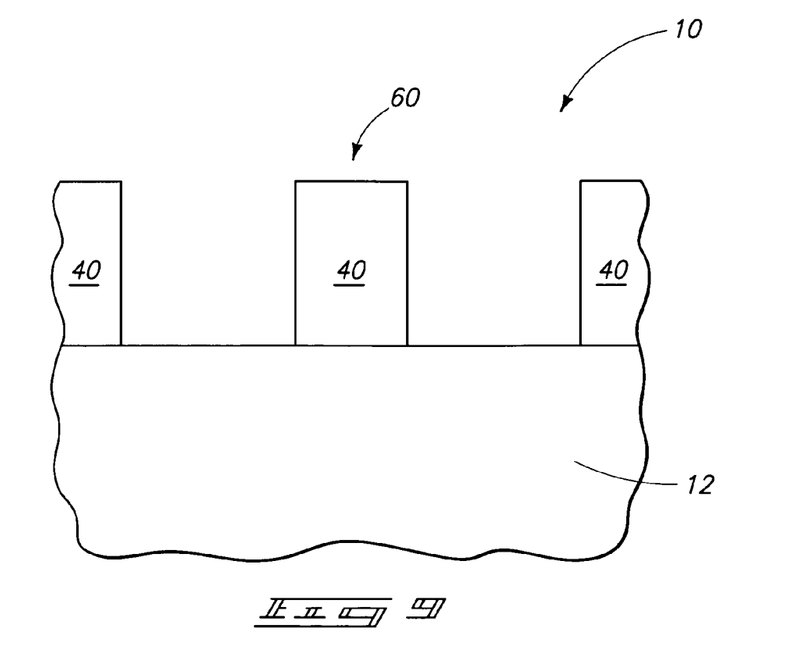
FIG. 9 is a view of the FIG. 8 substrate at a processing step subsequent to that depicted by FIG. 8.

Referring to FIG. 9, second silicon nitride-comprising layer 30, first silicon nitride-comprising layer 28, and silicate glass-comprising material 14 have been etched from the substrate.

Figure 10:
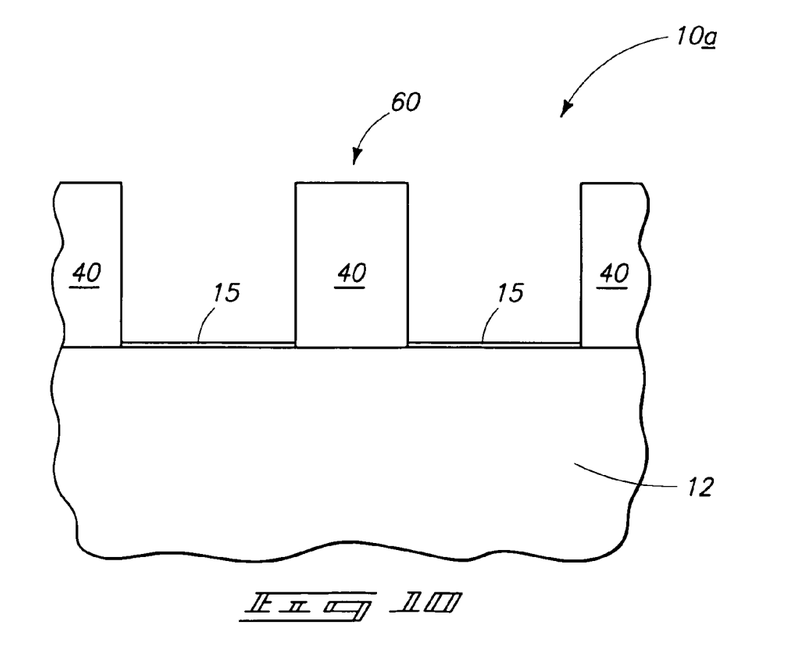
FIG. 10 is a diagrammatic section of an alternate semiconductor wafer fragment in process in accordance with an aspect of the invention.

The above depicted exemplary preferred embodiment shows silicate glass-comprising material 14 being formed on monocrystalline material 12. Certain aspects of the invention also contemplate formation of silicate glass-comprising material 14 over one or more intervening materials. For example and by way of example only, an alternate embodiment wafer fragment 10a to that depicted in FIG. 9 is shown in FIG. 10. Like numerals from the first described embodiment are utilized where appropriate, with differences being indicated with the suffix "a" or with different numerals. FIG. 10 depicts an exemplary embodiment thermal oxide layer 15 having a thickness no greater than 75 Angstroms having been provided prior to provision of silicate glass-comprising material 14 (not shown in FIG. 10). Thermal oxide layer 15 in the depicted preferred embodiment is received on monocrystalline material 12, and whereby the silicate glass-comprising material would be formed on such thermal oxide layer. Openings 16, 18 and 20 (not shown) in such instance would thereby also extend through thermal oxide layer 15 at some point effective to expose material 12 for epitaxial growth of a silicon-comprising layer 40 therefrom. Further in the depicted embodiment, thermal oxide layer 15 contacts layer 40.

Regardless, FIGS. 9 and 10 depict exemplary preferred embodiments whereby etching has occurred to be effective to leave a free-standing projection 60 of epitaxially grown silicon-comprising layer 40 projecting from monocrystalline material 12 which was at base 26 of the previously formed opening 18. In the context of this document, a "free-standing projection" is un-supported by any laterally adjacent material over the monocrystalline material from which the silicon-comprising layer was epitaxially grown at least at this point in the process. However, a "free-standing projection" does not preclude presence of a thermal oxide layer having a thickness no greater than 75 Angstroms received over the monocrystalline material from which the silicon-comprising layer was epitaxially grown, with accordingly the depicted pillars 60 in FIGS. 9 and 10 constituting exemplary such free-standing projections. Of course and regardless, formation of a free-standing projection of epitaxially grown silicon-comprising material is not required in all aspects of the invention.

Further, the invention in one implementation contemplates a method of forming a layer comprising epitaxial silicon as-claimed whereby at least silicate glass-comprising material is etched from the substrate effective to leave a free-standing projection of epitaxially grown silicon-comprising layer projecting from the monocrystalline material which was at the base of the previously formed opening, and independent of whether the opposing sidewalls are lined with a silicon nitride-comprising material or any other material. Accordingly, such implementation of the invention for example if void of any lining might result in epitaxially grown silicon-comprising layer contacting the silicate glass-comprising material within the opening during the epitaxially growth.

Figure 11:
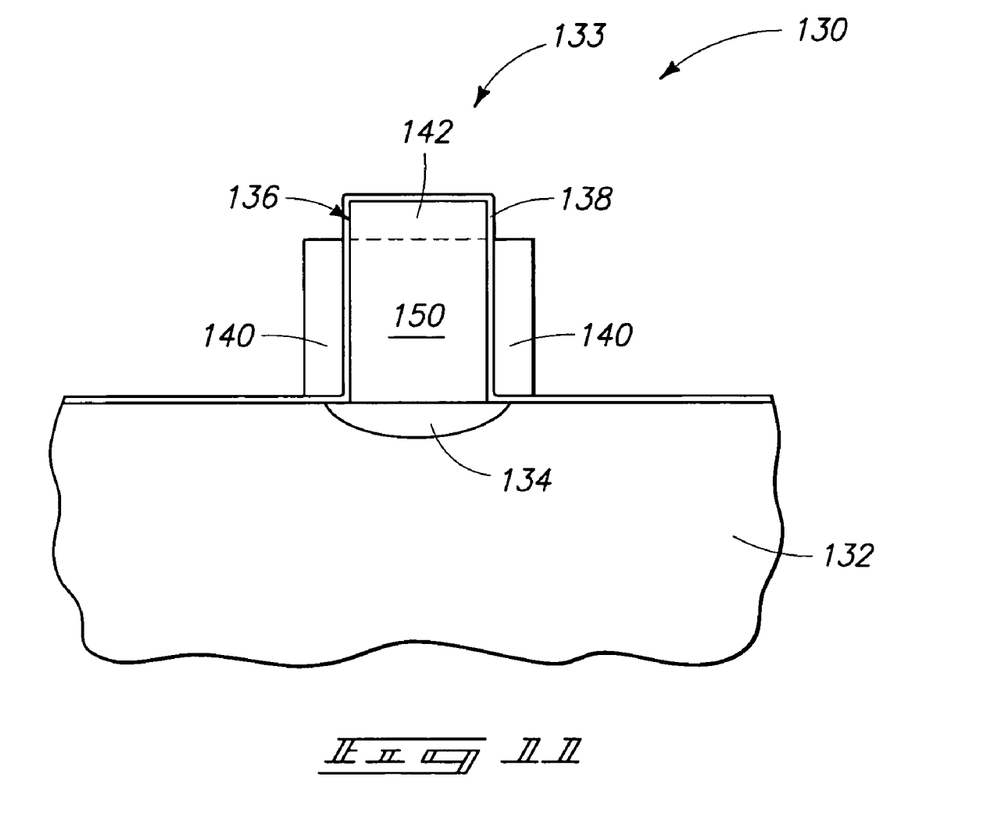
FIG. 11 is a diagrammatic section of an exemplary embodiment field effect transistor manufactured in accordance with an aspect of the invention.

Attributes of the invention encompass methods of incorporating any of the above-described epitaxial layers into a component of a field effect transistor. By way of example only, a preferred such component comprises a channel region of a field effect transistor, and further preferably where the field effect transistor is vertically oriented. For example and by way of example only, FIG. 11 depicts a substrate fragment 130 comprising a substrate 132 and associated vertical field effect transistor 133. Substrate 132 preferably comprises a semiconductor substrate, and for example as depicted, transistor 133 comprises a diffusion region 134 or other region formed within semiconductive material (i.e., monocrystalline silicon, whether bulk, epitaxially grown or otherwise) and which comprises a source/drain region of transistor 133. Substrate fragment 130 comprises a projecting layer 136, for example including one or more of the epitaxial silicon-comprising layers formed, and of compositions, as described above. A gate dielectric layer 138 is received over substrate 132 and epitaxial silicon-comprising projection 136. An exemplary preferred material is one or a combination of silicon dioxide and silicon nitride. A transistor gate 140 is received about projection 136. Exemplary preferred materials include one or a combination of conductively doped polysilicon, elemental metals, alloys of elemental metals, and conductive metal compounds. Projection 136 comprises a source/drain region 142 received elevationally outward of gate 140, and a channel region 150 therebetween. Conductivity enhancing doping within regions 134 and 142 would be higher than that of channel region 150, with transistor gate 140 being switchable to control current flow between source/drain regions 134 and 142 through channel region 150. Of course, some or all of the source/drain regions of the transistor might be fabricated to be encompassed by projection 136, with the gate 140 being sized appropriately.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a layer comprising epitaxial silicon, comprising:
    etching an opening into a silicate glass-comprising material received over a monocrystalline material, the etching being to the monocrystalline material effective to expose the monocrystalline material at a base of the opening;
    epitaxially growing a silicon-comprising layer within the opening from the monocrystalline material exposed at the base of the opening;
    etching the silicate glass-comprising material from the substrate effective to leave a free-standing projection of the epitaxially grown silicon-comprising layer projecting from the monocrystalline material which was at the base of the opening; and
    prior to the growing, lining the opening with a material other than silicate glass such that the epitaxially grown silicon-comprising layer does not contact the silicate glass-comprising material within the opening during the growing, the lining comprising forming insulative material atop the silicate glass-comprising material and within the opening to less than completely fill the opening, the insulative material being formed to a greater thickness atop the silicate glass-comprising material than over sidewalls of the opening and than over the base of the opening, the insulative material being different in composition from that of the silicate glass-comprising material.

2. The method of claim 1 wherein the silicate glass-comprising material comprises at least one of PSG, BSG and BPSG.

3. The method of claim 1 wherein the growing occurs at a temperature of at least 700° C.

4. The method of claim 3 wherein the growing occurs at a temperature of at least 800° C.

5. The method of claim 1 wherein the silicate glass-comprising material is formed on the monocrystalline material.

6. The method of claim 1 wherein the silicate glass-comprising material is formed over a thermal oxide layer having a thickness no greater than 75 Angstroms.

7. A method of forming a field effect transistor comprising epitaxial silicon, comprising:
    etching an opening into a silicate glass-comprising material received over a monocrystalline material, the etching being to the monocrystalline material effective to expose the monocrystalline material at a base of the opening;
    epitaxially growing a silicon-comprising layer within the opening from the monocrystalline material exposed at the base of the opening;
    etching the silicate glass-comprising material from the substrate effective to leave a free-standing projection of the epitaxially grown silicon-comprising layer projecting from the monocrystalline material which was at the base of the opening;
    the silicate glass-comprising material being formed over a thermal oxide layer having a thickness no greater than 75 Angstroms, the thermal oxide layer being received on the monocrystalline material and the silicate glass-comprising material being formed on the thermal oxide layer, at least a portion of the thermal oxide layer remaining and contacting the epitaxial material of the free-standing projection after the etching of the silicate glass-comprising material from the substrate effective to leave the free-standing projection;
    prior to the growing, lining the opening with a material other than silicate glass such that the epitaxially grown silicon-comprising layer does not contact the silicate glass-comprising material within the opening during the growing, the lining comprising forming insulative material atop the silicate glass-comprising material and within the opening to less than completely fill the opening, the insulative material being formed to a greater thickness atop the silicate glass-comprising material than over sidewalls of the opening and than over the base of the opening, the insulative material being different in composition from that of the silicate glass-comprising material; and
    incorporating the epitaxially grown silicon-comprising layer into a component of a field effect transistor, at least a portion of the thermal oxide layer remaining and contacting the epitaxially grown silicon-comprising material of the field effect transistor component in a finished circuitry construction.

8. The method of claim 1 wherein the lining comprises exposing sidewalls of the opening to an activated nitrogen species generated by remote plasma effective to form a silicon nitride-comprising layer over the sidewalls.

9. The method of claim 1 wherein the lining comprises chemical vapor depositing a silicon nitride-comprising layer within the opening.

10. The method of claim 1 wherein the lining comprises:
    exposing sidewalls of the opening to an activated nitrogen species generated by remote plasma effective to form a first silicon nitride-comprising layer over the sidewalls; and
    after the exposing, chemical vapor depositing a second silicon nitride-comprising layer within the opening over the first silicon nitride-comprising layer.

11. The method of claim 1 wherein the opening comprises a line trench in the silicate glass-comprising material.

12. The method of claim 1 comprising incorporating the epitaxially grown silicon-comprising layer into a component of a field effect transistor.

13. The method of claim 12 wherein the component comprises a channel region of the field effect transistor, the field effect transistor being vertically oriented.

14. The method of claim 12 wherein the component comprises a source/drain region of the field effect transistor, the field effect transistor being vertically oriented.

15. The method of claim 12 wherein the transistor is vertically oriented, and the epitaxially grown silicon-comprising layer is incorporated into both a channel region and a source/drain region of the vertical transistor.

16. A method of forming a layer comprising epitaxial silicon, comprising:
    providing an opening within a silicate glass-comprising material received over a monocrystalline material, the opening comprising opposing sidewalls comprising silicate glass-comprising material;

lining the opposing sidewalls of the opening with a silicon nitride-comprising material, monocrystalline material being exposed at a base of the lined opening, the silicon nitride-comprising material lining all of the opposing sidewalls of the silicate glass-comprising material, the silicon nitride-comprising lining being thicker over the sidewalls at an uppermost portion of the opening than at a lowestmost portion of the opening; and epitaxially growing a silicon-comprising layer within the opening from the exposed monocrystalline material within the lined opening.

17. The method of claim 16 wherein the silicon nitride-comprising lining has a maximum thickness which is no greater than 500 Angstroms.

18. The method of claim 16 wherein the silicon nitride-comprising lining has a maximum thickness which is no greater than 250 Angstroms.

19. The method of claim 16 wherein the silicate glass-comprising material comprises at least one of PSG, BSG and BPSG.

20. The method of claim 16 wherein the growing occurs at a temperature of at least 700° C.

21. A method of forming a layer comprising epitaxial silicon, comprising:

providing an opening within a silicate glass-comprising material received over a monocrystalline material, the opening comprising opposing sidewalls comprising silicate glass-comprising material;

lining the opposing sidewalls of the opening with a silicon nitride-comprising material, monocrystalline material being exposed at a base of the lined opening, the silicon nitride-comprising material lining all of the opposing sidewalls of the silicate glass-comprising material, the lining comprising forming the silicon nitride-comprising material atop the silicate glass-comprising material and within the opening to less than completely fill the opening, the silicon nitride-comprising material being formed to a greater thickness atop the silicate glass-comprising material than over the sidewalls of the opening and than over the base of the opening; and epitaxially growing a silicon-comprising layer within the opening from the exposed monocrystalline material within the lined opening.

22. The method of claim 16 wherein the lining comprises exposing the sidewalls to an activated nitrogen species generated by remote plasma effective to form the silicon nitride-comprising material over the sidewalls.

23. The method of claim 16 wherein the lining comprises chemical vapor depositing the silicon nitride-comprising material within the opening.

24. The method of claim 16 wherein the lining comprises:

exposing the sidewalls to an activated nitrogen species generated by remote plasma effective to form a first silicon nitride-comprising layer over the sidewalls; and after the exposing, chemical vapor depositing a second silicon nitride-comprising layer within the opening over the first silicon nitride-comprising layer.

25. The method of claim 16 wherein the opening comprises a line trench in the silicate glass-comprising material.

26. The method of claim 16 comprising incorporating the epitaxially grown silicon-comprising layer into a component of a field effect transistor.

27. The method of claim 26 wherein the component comprises a channel region of the field effect transistor, the field effect transistor being vertically oriented.

28. The method of claim 26 wherein the component comprises a source/drain region of the field effect transistor, the field effect transistor being vertically oriented.

29. The method of claim 26 wherein the transistor is vertically oriented, and the epitaxially grown silicon-comprising layer is incorporated into both a channel region and a source/drain region of the vertical transistor.

30. The method of claim 16 comprising etching the silicate glass-comprising material from the substrate effective to leave a free-standing projection of the epitaxially grown silicon-comprising layer projecting from the monocrystalline material which was at a base of the opening.

31. A method of forming a layer comprising epitaxial silicon, comprising:

providing an opening within a silicate glass-comprising material received over a monocrystalline material, the opening comprising opposing sidewalls comprising silicate glass-comprising material, the opening comprising a base;

forming insulative material atop the silicate glass-comprising material and within the opening along the opposing sidewalls to less than completely fill the opening, the insulative material being formed to a greater thickness atop the silicate glass-comprising material than over the opposing sidewalls and than over the base of the opening, the insulative material being different in composition from that of the silicate glass-comprising material;

anisotropically etching the insulative material effective to expose monocrystalline material at the base of the opening and to leave at least some of the insulative material atop the silicate glass-comprising material proximate the opening; and epitaxially growing a silicon-comprising layer within the opening from the exposed monocrystalline material at the base of the opening.

32. The method of claim 31 wherein the insulative material comprises silicon nitride.

33. The method of claim 31 wherein the insulative material comprises silicon dioxide.

34. The method of claim 31 wherein the insulative material comprises undoped silicon dioxide.

35. The method of claim 31 wherein the insulative material comprises silicon nitride and silicon dioxide.

36. The method of claim 31 wherein the insulative material comprises silicon nitride and undoped silicon dioxide.

37. The method of claim 31 wherein the insulative material comprises silicon oxynitride.

38. A method of forming a layer comprising epitaxial silicon, comprising:

providing an opening within a silicate glass-comprising material received over a monocrystalline material, the opening comprising opposing sidewalls comprising silicate glass-comprising material, the opening comprising a base;

exposing the opposing sidewalls to an activated nitrogen species generated by remote plasma effective to form a first silicon nitride-comprising layer over the opposing sidewalls, and exposing a top of the silicate glass-comprising material outside of the opening to the activated nitrogen species generated by remote plasma effective to form the first silicon nitride-comprising layer over the top of the silicate glass-comprising material outside of the opening;

after the exposing, chemical vapor depositing a second silicon nitride-comprising layer over the first silicon nitride-comprising layer within the opening and over the top of the silicate glass-comprising material outside of the opening;

anisotropically etching the first and second silicon nitride-comprising layers effective to expose monocrystalline material at the base of the opening, the anisotropically etching leaving at least some of the first silicon nitride-comprising layer over the top of the silicate glass-comprising material outside of the opening; and epitaxially growing a silicon-comprising layer within the opening from the exposed monocrystalline material at the base of the opening.

39. The method of claim 38 wherein the first silicon nitride-comprising layer is deposited to a maximum thickness of from 5 Angstroms to 300 Angstroms.

40. The method of claim 38 wherein the first silicon nitride-comprising layer is deposited to a maximum thickness of from 5 Angstroms to 50 Angstroms.

41. The method of claim 38 wherein the second silicon nitride-comprising layer is deposited to a maximum thickness of from 100 Angstroms to 300 Angstroms.

42. The method of claim 38 wherein the growing occurs at a temperature of at least 700° C.

43. The method of claim 31 wherein the forming comprises:

exposing the sidewalls to an activated nitrogen species generated by remote plasma effective to form a first silicon nitride-comprising layer over the sidewalls; and after the exposing, chemical vapor depositing a second silicon nitride-comprising layer within the opening over the first silicon nitride-comprising layer.

44. The method of claim 43 wherein the second silicon nitride-comprising layer is not chemical vapor deposited conformally over the base of the opening.

45. The method of claim 31 wherein the insulative material is thicker over the sidewalls at an uppermost portion of the opening than at a lowestmost portion of the opening.

46. The method of claim 31 wherein the growing occurs at a temperature of at least 700° C.

47. The method of claim 46 wherein the growing occurs at a temperature of at least 800° C.

48. The method of claim 38 wherein the second silicon nitride-comprising layer is not chemical vapor deposited conformally over the base of the opening.

49. The method of claim 38 wherein the growing occurs at a temperature of at least 700° C.

50. The method of claim 49 wherein the growing occurs at a temperature of at least 800° C.

51. The method of claim 38 comprising etching the silicate glass-comprising material, the first silicon nitride-comprising layer and the second silicon nitride-comprising layer from the substrate effective to leave a free-standing projection of the epitaxially grown silicon-comprising layer projecting from the monocrystalline material which was at the base of the opening.

52. The method of claim 38 wherein the anisotropically etching leaves at least some of the second silicon nitride-comprising layer over the top of the silicate glass-comprising material outside of the opening.

53. The method of claim 7 wherein the component comprises a channel region of the field effect transistor, the field effect transistor being vertically oriented.

* * * * *